United States Patent [19]
Haas et al.

[11] Patent Number: 5,540,780
[45] Date of Patent: Jul. 30, 1996

[54] MOLECULAR BEAM EPITAXY EFFUSION CELL

[75] Inventors: Trice W. Haas; Kurt G. Eyink, both of Beavercreek, Ohio

[73] Assignee: The United States of America as represented by the Secretary of the Air Force, Washington, D.C.

[21] Appl. No.: 494,114

[22] Filed: Jun. 23, 1995

[51] Int. Cl.⁶ .................................................. C23C 16/00
[52] U.S. Cl. ...................... 118/715; 118/724; 118/725; 117/201; 117/203
[58] Field of Search .................................. 117/201, 203; 118/724, 725, 715

[56] References Cited

U.S. PATENT DOCUMENTS 4,018,566  4/1977  Zeuch et al. ............................ 117/201

FOREIGN PATENT DOCUMENTS 1604867  11/1990  U.S.S.R. .

Primary Examiner—R. Bruce Breneman
Assistant Examiner—Ramamohan Rao Paladugu
Attorney, Agent, or Firm—Bobby D. Scearce; Thomas L. Kundert

[57] ABSTRACT

A temperature controlled source cell for use in the practice of thin film depositions by molecular beam epitaxy is described which includes an optical sensor for monitoring source temperature, the sensor including a light pipe having one end near the source and the other end coupled to a fiber optic probe which carries light from the light pipe to a remote optical detector.

4 Claims, 1 Drawing Sheet

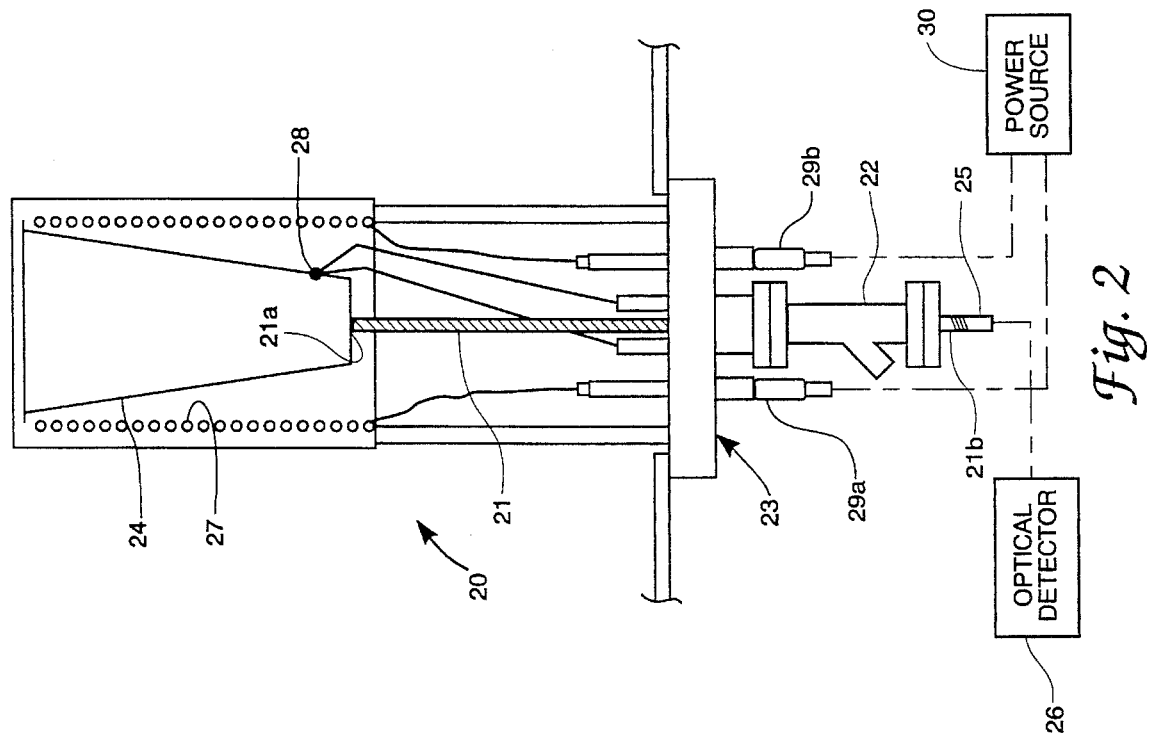
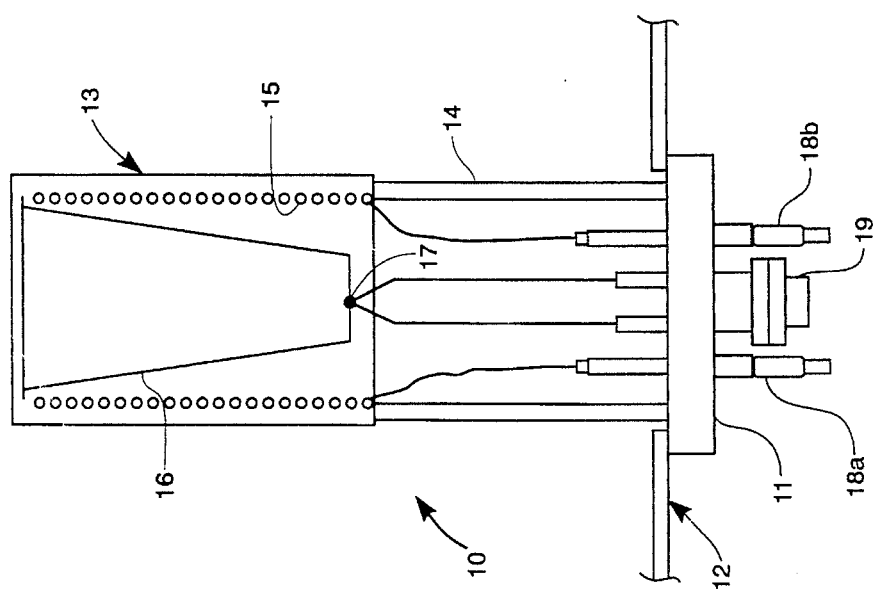

MOLECULAR BEAM EPITAXY EFFUSION CELL

RIGHTS OF THE GOVERNMENT

The invention described herein may be manufactured and used by or for the Government of the United States for all governmental purposes without the payment of any royalty.

BACKGROUND OF THE INVENTION

The present invention relates generally to systems and methods for vapor depositing thin films, and more particularly to an improved source cell for thin film deposition by molecular beam epitaxy.

Molecular beam epitaxy (MBE) is a physical vapor deposition technique performed in ultra high vacuum wherein a molecular beam flux of one or more constituent elements or compounds of interest from a heated source (e.g. effusion cell, Knudsen cell, source cell) is directed onto a heated (usually single crystal) substrate on which the atoms or molecules comprising the flux condense partially or completely and chemically react to form a deposited film. Film quality depends on several variables including source material, substrate temperature, beam flux ratio and growth rate, which often need to be determined experimentally. Various materials may be deposited as thin films using MBE, including oxides, semiconductors, insulators and metals. MBE technique allows precise control of film composition, crystallinity and crystal perfection, and production of films of extreme purity with morphologies at open and buffed interfaces that are smooth to within one atomic layer.

In the practice of an MBE process, the molecular beam flux from the heated source must be accurately controlled. In typical prior art processes, the flux is controlled by monitoring source temperature using a refractory metal (e.g. tungsten and rhenium alloy) thermocouple contacting the crucible containing the source material, which control suffers from numerous disadvantages and limitations. First, the crucible typically comprises an insulating material, such as pyrolitic boron nitride, and the thermocouple is held in contact with the crucible, which arrangement, combined with poor thermal transfer properties of the crucible material, results in inconsistent, variable and unreliable temperature readings for the source material. Second, the refractory metal thermocouple normally generates a very low output voltage, but must be used because only low vapor pressure, high temperature, non-contaminating materials may be used in contact with the heated MBE source. Electrical or electromagnetic noise in the MBE system may therefore interfere with the accuracy of the thermocouple readings. Third, the thermocouple is subject to brittle failure resulting in part from condensation of metallic and nonmetallic vapors on and alloying with the thermocouple. Fourth, crucible failure may result in hot, reactive liquid metals contacting the thermocouple, with consequent failure of the thermocouple and source cell.

The invention solves or substantially reduces in critical importance problems with prior art MBE processes and systems by providing an optical sensor for monitoring source temperature. The sensor provides greatly improved (10 to 50 times) sensitivity, reproducibility, stability and precision in temperature control of MBE effusion cells, increased reliability and ruggedness and improved resistance to electronic and electromagnetic interference, and is easily cleaned if contaminated. The invention provides new levels of precision and control of film composition and thickness and allows control of stoichiometry for certain non-lattice matched film growths. The high sensitivity and fast response time of the sensor substantially reduces flux transient effects in MBE source cells.

It is therefore a principal object of the invention to provide an improved source cell for vapor depositing thin films by MBE.

It is a further object of the invention to provide an optical sensor for monitoring source temperature in an MBE system.

It is a further object of the invention to provide improved control of the flux from a molecular beam epitaxy effusion cell.

It is yet another object of the invention to provide an MBE system having substantially reduced flux transients associated with the MBE source.

It is another object of the invention to provide improved temperature control in an MBE source cell.

These and other objects of the invention will become apparent as a detailed description of representative embodiments proceeds.

SUMMARY OF THE INVENTION

In accordance with the foregoing principles and objects of the invention, a temperature controlled source cell for use in the practice of thin film depositions by molecular beam epitaxy is described which includes an optical sensor for monitoring source temperature, the sensor including a light pipe having one end neat the source and the other end coupled to a fiber optic probe which carries light from the light pipe to a remote optical detector.

BRIEF DESCRIPTION OF THE DRAWINGS

The invention will be more clearly understood from the following detailed description of representative embodiments thereof read in conjunction with the accompanying drawings, wherein:

FIG. 1 is a view in axial section of a typical prior art MBE effusion cell source structure; and FIG. 2 is a view in axial section of an improved MBE effusion cell source structure with optical temperature sensing of crucible temperature according to the invention.

DETAILED DESCRIPTION

In accordance with a governing principle of the invention, the MBE source temperature is determined optically by sensing the radiant energy from the heated source. The amount of radiant energy from a body is related to its emissivity. The total emissitivity of the body is essentially the ratio of the radiant energy emitted from the body to the radiant energy emitted from a black body. The temperature is usually measured within a specific small wavelength range so that the spectral emissivity $\epsilon\lambda$, at the wavelength $\lambda$ is the appropriate quantity to use. The measured temperature $T_s$ and actual temperature T of the radiating body are related as follows:

$$\frac{1}{T} - \frac{1}{T_s} = \frac{\lambda \log_e \epsilon\lambda}{C}$$

where C is a constant.

Referring now to the drawings, FIG. 1 is a view in axial section of a typical prior art MBE effusion cell source 10 structure. Source 10 typically includes vacuum flange 11 for attachment to vacuum chamber 12 within which an MBE deposition is performed. Attached to flange 11 is radiative heat shield 13 and supporting structure 14 for heater coil 15 and crucible 16. Thermocouple 17 is usually held with a spring in thermal contact with the bottom of crucible 16, in a position substantially as shown. Hermetically sealed vacuum electrical passthroughs 18a, 18b, 19 in flange 11 provide means for electrical connection of heater coil 15 to an external source of power (not shown) and of thermocouple 17 with an external thermocouple readout instrument (also not shown). Typical materials for crucible 16 include pyrolitic boron nitride, pyrolytic graphite, zirconia, or other suitable high temperature corrosion resistant insulating crucible material. Source material for an MBE deposition is contained within crucible 16 and is heated to evaporation using heater coil 15 in conjunction with radiative heat shield 13.

Referring now to FIG. 2, shown therein is an axial sectional view of an improved MBE effusion cell source 20 structure according to the invention, including an optical temperature sensor and associated electronics. In source 20, optical light pipe 21 is disposed through hermetically sealed passthrough 22 in flange 23, with the light collecting end 21a disposed near or in contact with the bottom of crucible 24. The external end 21b of light pipe 21 is optically connected through fiber optic connector 25 or other suitable optical means to optical detector and associated measurement and data display instrumentation 26. Light pipe 21 must be constructed of material having suitable high temperature, low vapor pressure, inertness, and non-contaminating characteristics needed for use within an MBE chamber. Suitable materials for light pipe 21 may therefore include sapphire, quartz, various optical glasses, or other material as would occur to the skilled artisan guided by these teachings. In a system built in demonstration of the invention, sapphire was used as light pipe 21. Light pipe 21 may be hermetically sealed in passthrough 22 by brazing or other suitable vacuum sealing means. Placement of detector 26 remote of heater coil 27 and the MBE chamber 12' containing source 20 renders source 20 substantially immune to electrical noise associated with the MBE process. In an alternative configuration, passthrough 22 may be configured to accommodate thermocouple 28. Passthroughs 29a,29b provide for connecting heater coil 27 to external power source 30.

Detector 26 may be a photoconductive or photovoltaic detector, thermopile or other optical detector as would occur to the skilled artisan practicing the invention. A system built in demonstration of the invention included an Accufiber Model 100C High Temperature Measurement and Control System (manufactured by Luxtron Corp.). The system allowed temperatures as low as 200° C. to be measured and resolutions of 0.01° C. at temperatures above 500° C. Temperature may be controlled with this resolution over the temperature range 200° C. to 1100° C. The importance of this degree of temperature control may be demonstrated by considering the vapor pressure of a material such as indium as a function of temperature T as follows:

$$\log_{10} P = AT^{-1} + E$$

where P is pressure in torr and A and E are constants characteristic of the material (for indium, A=12,193 and E=8.013). At a source temperature of 937° K. the vapor pressure of indium is $10^{-5}$ torr, which is in the approximate range of many MBE parameters. A change of only 0.5° C. in operating temperature results in a 1.7% change in the flux which in turn produces compositional variations of the same order of magnitude in the MBE deposited film. In many cases where lattice matching of films to a substrate are required to minimize strain effects on the electronic properties of these films, variations of 0.1% or less are required, which is not attainable with existing thermocouple based systems (having variations of 0.2° to 0.5° C.).

This invention therefore provides an improved source cell for thin film deposition utilizing MBE. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. In a vacuum vapor deposition system for depositing a thin film by molecular beam epitaxy, said system including:

(a) a temperature controlled effusion source cell for use in vapor deposition of a thin film and a crucible for containing material for deposition as a thin film; and (b) means for heating said crucible and material;

an improvement which comprises an optical sensor for monitoring the temperature of said crucible and material, said sensor including a light pipe having first and second ends, said first end disposed near said crucible and said second end optically coupled to an optical detector.

2. The cell of claim 1 wherein said crucible comprises a high temperature resistant material selected from the group consisting of pyrolitic boron nitride, pyrolytic graphite, and zirconia.

3. The cell of claim 1 wherein said light pipe comprises an optical material selected from the group consisting of sapphire, quartz, and optical glasses.

4. In a temperature controlled effusion source cell for use in the vacuum vapor deposition of a thin film by molecular beam epitaxy, including a crucible for containing material for deposition as said thin film and means for heating the crucible and material, an improvement which comprises, an optical sensor for monitoring the temperature of said crucible and material, said sensor including a light pipe having first and second ends, said first end for placement near said crucible and said second end optically coupled to an optical detector.

* * * * *